US008330529B1

(12) United States Patent
Zhang et al.

(10) Patent No.: US 8,330,529 B1
(45) Date of Patent: Dec. 11, 2012

(54) VOLTAGE REGULATOR

(75) Inventors: Wenfeng Zhang, San Jose, CA (US); Qi Zhang, Chandler, AZ (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/696,010

(22) Filed: Jan. 28, 2010

(51) Int. Cl.
*H03K 3/01* (2006.01)

(52) U.S. Cl. ........ 327/534; 327/530; 327/538; 323/312; 323/316; 324/416

(58) Field of Classification Search .................. 327/530, 327/538–543, 534; 323/312, 313, 315, 316; 324/416
See application file for complete search history.

(56) References Cited

U.S. PATENT DOCUMENTS

| | | | | |
|---|---|---|---|---|
| 5,563,526 | A * | 10/1996 | Hastings et al. | 326/37 |
| 5,721,484 | A * | 2/1998 | Ngo et al. | 323/313 |
| 7,042,302 | B2 * | 5/2006 | Chien | 331/185 |
| 7,427,854 | B2 * | 9/2008 | Redoute et al. | 323/316 |

* cited by examiner

*Primary Examiner* — Lincoln Donovan
*Assistant Examiner* — Shikha Goyal
(74) *Attorney, Agent, or Firm* — LeRoy D. Maunu

(57) ABSTRACT

Embodiments of a method, apparatus and circuit for voltage regulation are disclosed. One embodiment of a circuit includes a first field effect transistor (FET) having a gate, a drain and a source. A current source is connected to the drain of the FET. A second FET has a source connected to the source of the first FET by a node. The second FET also has a gate. A low-pass filter circuit has an input connected to the gate of the first FET and an output connected to the gate of the second FET.

19 Claims, 5 Drawing Sheets

VOLTAGE REGULATOR

FIELD OF THE INVENTION

An embodiment of the present invention generally relates to a voltage regulator, and more particularly to efficient, fast and/or small area voltage regulation circuits.

BACKGROUND

As technology advances, integrated circuits are subject to competing demands relating to increases in processing power, increases in operating speeds, power consumption limitations and/or physical size limitations.

High-speed data communications can often require the use of synchronization circuitry, such as delay-locked loops (DLLs) or phase-locked loops (PLLs). Such circuits allow for synchronization of data signals and clocks. While such circuits can help compensate for skew, these and other circuits, can be adversely affected by power supply jitter. Transient noise from other circuits can be a significant source of such jitter.

On-chip voltage regulators are sometimes desired to help reduce or eliminate such jitter. Stability, power consumption, bandwidth and physical area of on-chip regulators can significantly impact the operating characteristics of a chip and become more prominent as the number of regulators increases.

The present invention may address one or more of the above issues.

SUMMARY

An embodiment of the present invention is a circuit that includes a first field effect transistor (FET) having a gate, a drain and a source. A current source is connected to the drain of the FET. A second FET has a source connected to the source of the first FET by a node. The second FET also has a gate. A low-pass filter circuit has an input connected to the gate of the first FET and an output connected to the gate of the second FET.

In another embodiment of the present invention, a circuit includes a first feedback control circuit that is configured and arranged to generate a local supply voltage from a reference voltage. The first feedback control circuit has a bandwidth. A second feedback circuit includes a first field-effect transistor (FET) and a current source that is configured and arranged to set an amount of current through the first FET. A second FET is configured and arranged to mirror current through the first FET. A filter circuit is configured and arranged to inhibit the mirroring of the second FET for changes of the local supply voltage that exceed the bandwidth of the first feedback control circuit.

In yet another embodiment of the present invention, a programmable integrated circuit is provided. The circuit includes programmable fabric and a plurality of local clock synchronization circuits distributed throughout the programmable fabric. A plurality of voltage regulator circuits provide regulated voltage to the plurality of local clock synchronization circuits. Each voltage regulator of the plurality includes a first field effect transistor (FET) having a gate, a drain and a source. A current source is connected to the drain of the FET. A second FET has a gate and a source connected to the source of the first FET by a node. A low-pass filter circuit has an input connected to the gate of the first FET and an output connected to the gate of the second FET.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Figure 1:
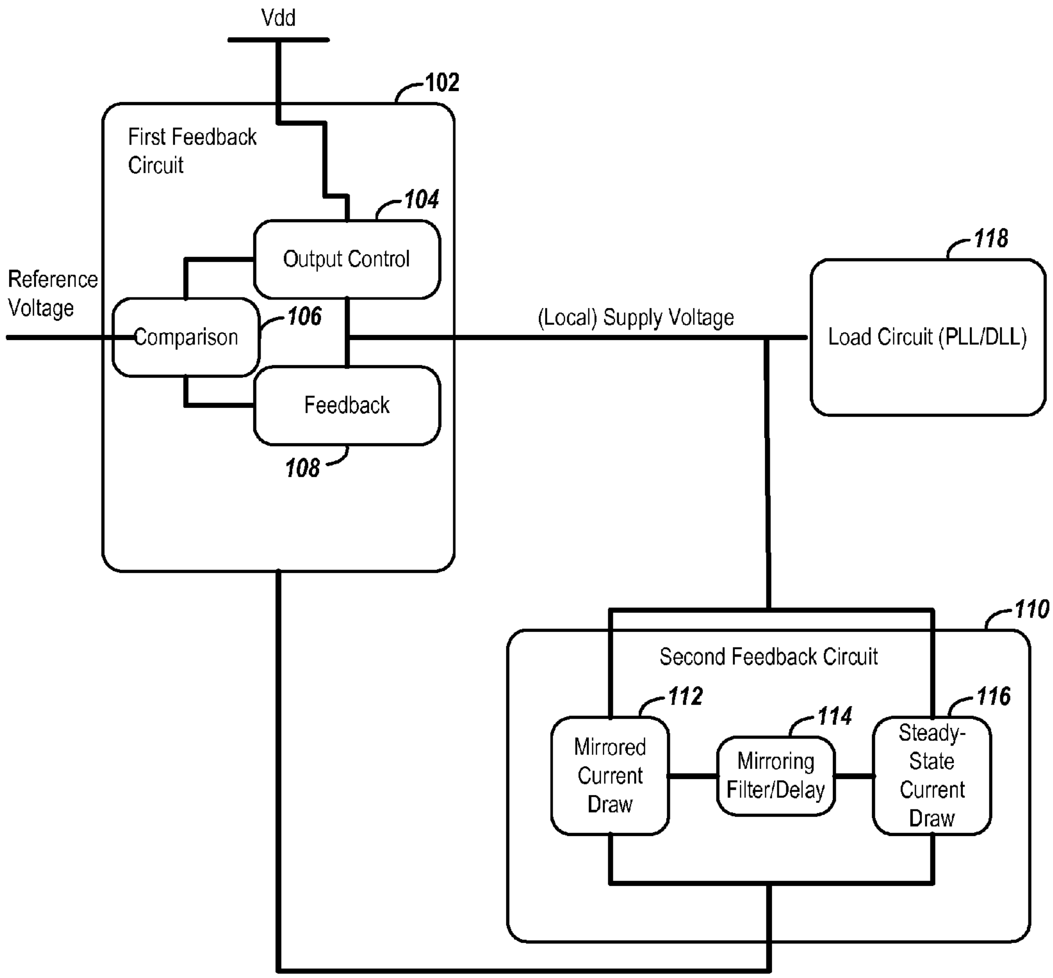
FIG. 1 depicts a block diagram for a voltage regulator, consistent with an embodiment of the present invention.

Various embodiments of the present invention are described in terms of discrete circuit elements. Those skilled in the art will appreciate that the invention could be implemented using various circuit configurations, as might be applicable to the specific application, such as to programmable logic integrated circuits (ICs) in general, to field-programmable gate arrays (FPGAs), or to applications not involving programmable logic ICs.

Aspects of the present invention are particularly well-suited for applications in which high-bandwidth voltage regulation is desired but where physical area and power constraints are also at issue. While not limited thereto, particular implementations are discussed in connection with integrated circuits such as, e.g., programmable logic integrated circuits. Programmable logic integrated circuits can include programmable fabric spread across a large area of the integrated circuit, chip or package. Thus, the signal routing paths within the integrated circuit can sometimes be significant. For high speed data communications, clock and data skew can become a significant issue. Accordingly, some programmable logic integrated circuits include skew compensation circuits located throughout the programmable logic fabric and other areas. For instance, DLL and/or PLL circuits can be implemented to control the phase of a distributed clock signal. These types of circuits, however, can be particularly susceptible to noise on the power supply (e.g., due to dependence upon VCO's, delay chains and phase comparators). Due to the large number of such circuits, which are sensitive to power supply noise, in many programmable logic integrated circuits, even small improvements in voltage regulation can provide significant overall circuit gains.

One embodiment of the present invention is directed toward a voltage regulation circuit. The voltage regulation circuit can be particularly useful for providing high bandwidth voltage regulation with a circuit that has low power draw and that occupies low physical area on chip. Particular implementations provide a high bandwidth filtering aspect that emulates capacitive filtering using field-effect transistor logic.

In one or more embodiments of the present invention, a voltage regulation circuit is implemented with low static current draw and relatively high current draw for filtering of high-frequency noise on the regulated supply voltage. This is particularly useful for a low-power circuit that provides adequate voltage regulation characteristics.

One or more embodiments of the present invention relate to the use of multiple feedback circuits to provide voltage regulation. A first feedback circuit provides regulation at a relatively low bandwidth. This low bandwidth characteristic can be particularly useful for implementing the feedback circuit with low static current draw. A second feedback circuit provides regulation at a relatively high bandwidth. Particular implementations of the second feedback circuit rely upon current mirroring between FETs. A first FET is set to a given current draw, which is mirrored by a second FET. This mirroring is accomplished by electrically connecting the gates and sources of each of the FETs. To provide the desired filtering or regulation, a mirroring delay or filter component is implemented to inhibit mirroring of the current for high-frequency changes in the source voltage, which is also the regulated voltage. This causes the overall current drawn by the second feedback to counteract high-frequency voltage changes on the supply voltage. Once the supply voltage stabilizes to a relatively steady-state value, the mirroring delay or filter ceases to inhibit the mirroring and the current draw returns to the steady state value.

As is generally understood, the term mirroring is used to denote proportional current draw between the FETs and is not necessarily limited to the same current value for each FET. One or more embodiments of the present invention recognize that the current of a mirroring FET is dependent upon channel width and lengths. Thus, by adjusting the ratio of widths of the two transistors, multiples of the reference current can be generated. For instance, the reference current can be relatively low, while the mirrored current is several times the reference current. This can be particularly useful for providing a low, steady-state current draw while providing a sufficient response should the regulated voltage dip below the desired value.

Turning now to the figures, FIG. 1 depicts a block diagram for a voltage regulator, consistent with an embodiment of the present invention. A first feedback circuit 102 produces an output voltage (local supply voltage) based upon an input reference voltage. A global voltage supply (Vdd) provides the power used for the first feedback circuit to produce the local supply voltage. An output control component 104 drives the local supply voltage to the desired level. Feedback component 108 provides the local supply voltage to comparison component 106. Comparison component 106 compares the local supply voltage to the reference voltage and adjusts the output control 104 accordingly. The regulated local supply voltage is then used by a load circuit 118, which in particular implementations can be analog circuitry (e.g., a PLL or a DLL).

The frequency of noise the first feedback circuit 102 is able to compensate for, or its bandwidth, is determined by the design parameters of the circuit. In order to provide high bandwidth and high stability, the design parameters can require a significant amount of current and physical area. For instance, some feedback circuits require a significant steady state current draw in the form of a current source sufficient to compensate for voltage overshoot. To further improve the bandwidth, filtering capacitance is also included. High-value capacitors, however, often require significant physical area. Accordingly, aspects of the present invention relate to the use of a second feedback circuit 110.

The second feedback circuit 110 is designed to provide regulation of high frequency components (a high bandwidth regulator) of the local supply voltage. Thus, the first feedback circuit 102 can be designed with a low bandwidth and high stability (and also with a low power consumption and/or physical area), while the overall system operates as a regulator with high bandwidth.

In particular implementations, the second feedback circuit 110 provides high bandwidth regulation in a manner that is particularly well-suited for a stable, low power and low area solution. For instance, the second feedback circuit 110 can be configured to provide a response that emulates or closely follows the response of a filter capacitor. In particular, the second feedback circuit 110 can use a current mirror and a mirroring filter/delay. A steady-state current draw component 116 provides a reference current for such mirroring. Under steady-state conditions of the local supply voltage, the reference current is mirrored by the mirrored current draw component 112. This mirrored current draw can be a multiple of the steady-state current draw (e.g., 50 μA steady state and 500 μA mirrored). Mirroring filter/delay component 114 inhibits mirroring for high-frequency changes to local supply voltage. Thus, for high frequency changes of the local supply voltage the mirrored current draw 112 deviates from the steady-state current.

More particularly, mirrored current draw component 112 is designed such that absent the mirroring input from steady-state current draw, the produced current opposes changes to local supply voltage. Thus, an increase in local supply voltage creates an increase in current, thereby reducing the local supply voltage. A decrease in local supply voltage creates a decrease in current, thereby increasing the local supply voltage. This is similar to the response of a capacitor, i.e., a capacitor opposes voltage changes.

Figure 2:
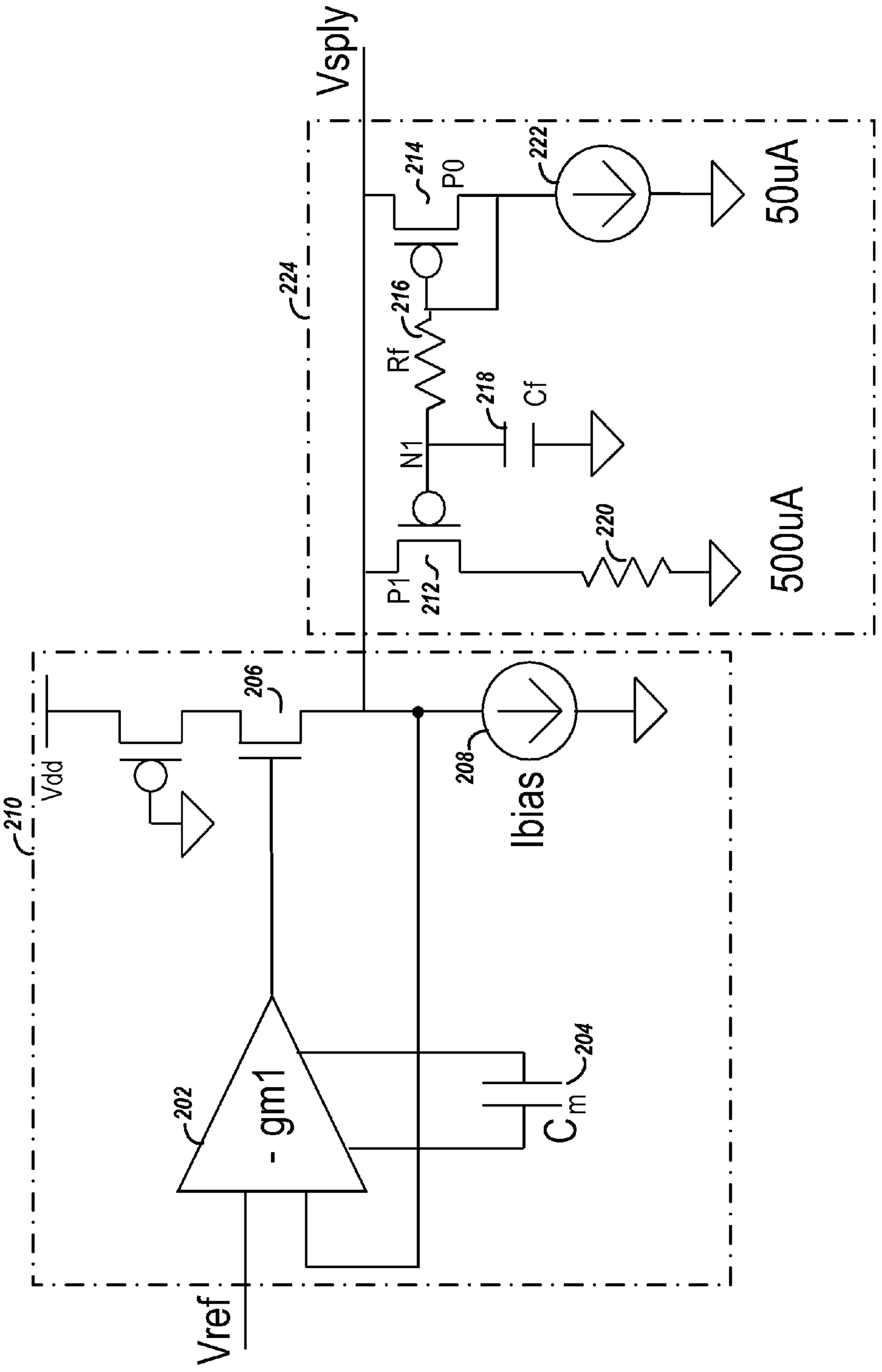
FIG. 2 depicts a circuit diagram for a voltage regulator, consistent with an embodiment of the present invention.

FIG. 2 depicts a circuit diagram for a voltage regulator, consistent with an embodiment of the present invention. A first feedback circuit 210 operates to generate Vsply. This first feedback circuit 210 can be designed with a relatively low bandwidth. Gain component 202 produces an output based upon a comparison between Vref (reference voltage) and Vsply (local supply voltage). Capacitor Cm (204) provides filtering for the operation of gain component 202. When Vsply is below Vref, the voltage on the gate of FET 206 is driven higher. By virtue of the connection to Vdd, this causes the Vsply voltage to increase. When Vsply is above Vref, the voltage on the gate of FET 206 is driven lower, which decreases the current through FET 206 and helps reduce the Vsply voltage. Current source 208 (Ibias) is an optional component that can be added to improve the response of the feedback circuit 210.

A second feedback circuit 224 also helps generate Vsply. This second feedback circuit 224 can be designed to have a higher bandwidth than the first feedback circuit 210. FET 214 is configured in combination with current source 222 to produce a voltage at the gate of the FET 214. This voltage is a function of the amount of current through the FET, by virtue of current source 222, and the voltage level of Vsply. The gate of FET 212 is connected such that during steady state of Vsply the current through FET 212 mirrors that of FET 214. In particular, the source of FET 212 is connected to Vsply and the gate of FET 212 is connected to the gate of FET 214.

Resistor 216 and capacitor 218 combine to form a low-pass (RC) filter for filtering high-frequency voltage changes of the gate of FET 214 from reaching the gate of FET 212. High-frequency changes of Vsply cause corresponding high-frequency changes of the voltage seen on the gate of FET 214. Thus, the RC-filter inhibits these high-frequency signals from reaching the gate of FET 212, and thereby inhibits the mirroring function of FET 212 for high-frequency signals. The result of this filtering is that changes in Vsply cause a corresponding change in the current drawn by FET 212. This is due to changes in Vgs (gate-source voltage). More particularly, FET 212 increases current draw in response to increases in Vsply and decreases current draw in response to decreases in Vsply. This effect is particularly useful for counteracting high-frequency changes to Vsply.

Slower/longer-lasting changes to Vsply allow for the current draw of FET 212 to return to steady state operation in which the current of FET 214 is mirrored. In this manner, the feedback circuit 210 dominates the voltage regulation for low-frequency noise and the feedback circuit 224 dominates the voltage regulation for high-frequency noise.

The effect of feedback circuit 224 is emulation of a capacitor in that the current drawn by the circuit increases for voltage increases, decreases for voltage decreases and then stabilizes according to the steady-state voltage. Thus, feedback circuit 224 resists voltage changes for high-frequency components. The area of feedback circuit 224, however, can be 40% less than that of an equivalent capacitor. Moreover, the steady-state current draw is relatively low.

Particular implementations recognize that the steady-state current draw is an important component of the overall circuit design. As shown in FIG. 2 as a non-limiting example, the circuit can be designed to operate with current source 222 set at only 50 μA and the steady-state current draw of FET 212 set at 500 μA. While the steady-state current draw is still very low, the reactive current draw can be significantly higher (e.g., 2 milliamps). Thus, the circuit can have low steady-state draw while providing good filter characteristics.

One or more embodiments of the present invention recognize that the filter circuit 224 can operate substantially independent from glitches or jitter of the global supply voltage. In particular, the response of filter circuit 224 opposes high-speed voltage changes of the local supply voltage. This response is substantially independent of the global supply voltage.

The specific values of the components of the feedback circuits can be adjusted for the particular application. For instance, the RC filter can be chosen such that the bandwidth of the low-pass filter is much smaller than the dominate noise frequency on Vsply. As an example, the RC filter can be designed with a corner frequency of 16 MHz by using a 1 pF capacitor and a 10 kΩ resistor. The ratios of the FET channel widths can also be appropriately set (e.g., 5 μm and 50 μm). Variations from these values can be made to tailor the RC filter and the feedback circuit to the desired frequency/bandwidth.

Figure 3:
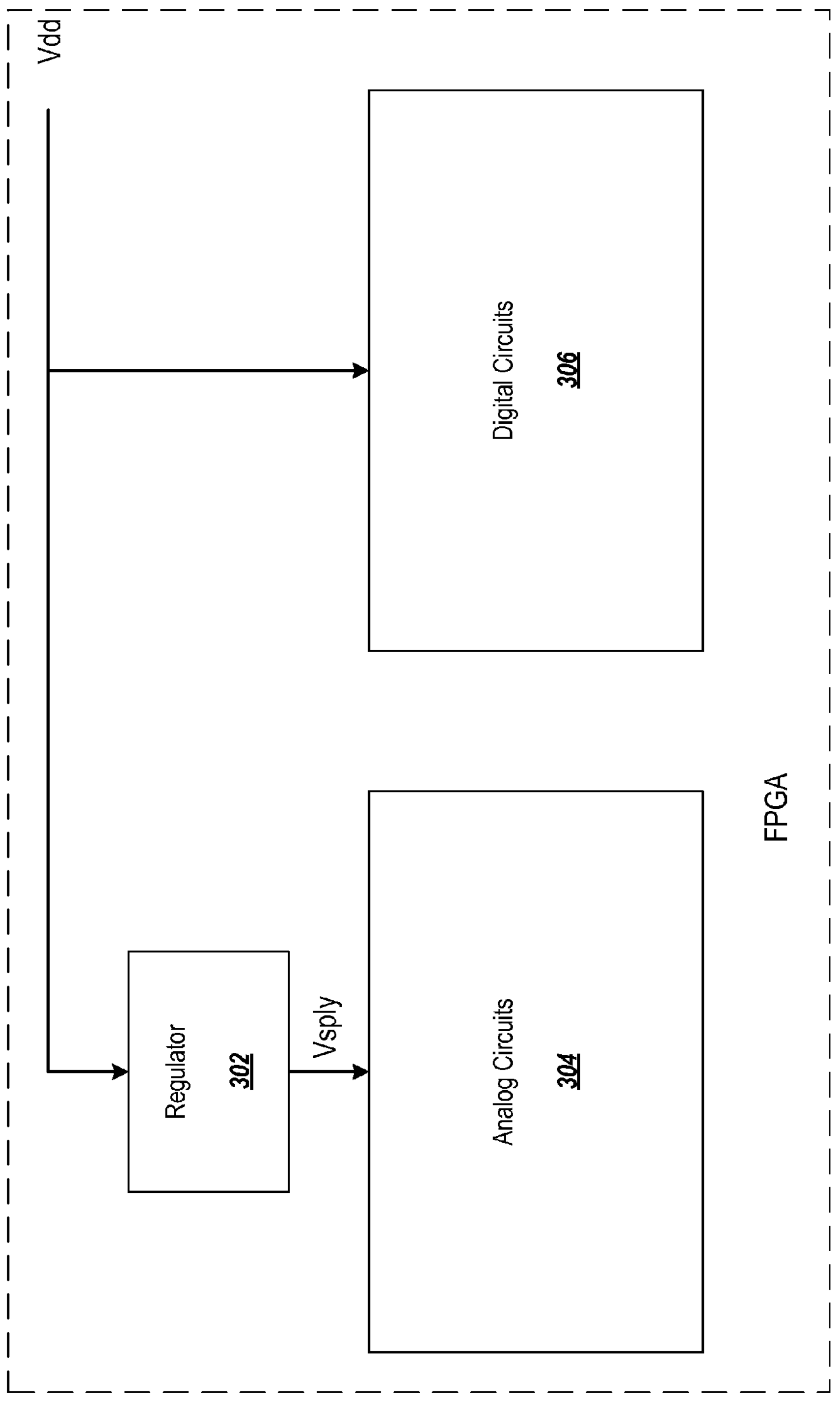
FIG. 3 depicts a block diagram of a system using a voltage regulator, consistent with an embodiment of the present invention.

FIG. 3 depicts a block diagram of a system using a voltage regulator, consistent with an embodiment of the present invention. The basic components are consistent with a programmable logic integrated circuit. In particular the integrated circuit distributes power in the form of a global voltage Vdd. Vdd, however, can be subject to significant amounts of noise. For instance, long routing paths for Vdd can introduce noise from nearby digital circuits 306 and also introduce undesirable inductance, which can lead to voltage undershoot or overshoot. Some circuits are designed to operate using ultra-low voltages, which are unsuitable for global power distribution. Moreover, stringent noise requirements can unduly complicate the design of a high-power voltage regulator circuit used to provide the global voltage supply Vdd. Although digital circuits 306 can have problems with noisy supply voltages, analog circuits 304 can be particularly susceptible to errors caused by noisy power supply. For instance, a noisy power supply can cause PLL and DLL circuits to lose synchronization and/or become unstable. Accordingly, local regulators 302 are distributed throughout the integrated circuit. The number of local regulators may be significant since circuit blocks in the programmable logic IC can be individually turned on and off.

As discussed herein, the number of local regulators can be significant for many applications. For instance, a large programmable logic integrated circuit can include thousands of local regulators. Thus, the power consumption and area of the local regulators can be an important consideration. Aspects of the present invention can emulate the filtering of a capacitor while taking up to 40% less area. Other aspects of the present invention are particularly useful for providing low-power consumption during steady-state operation.

Figure 4:
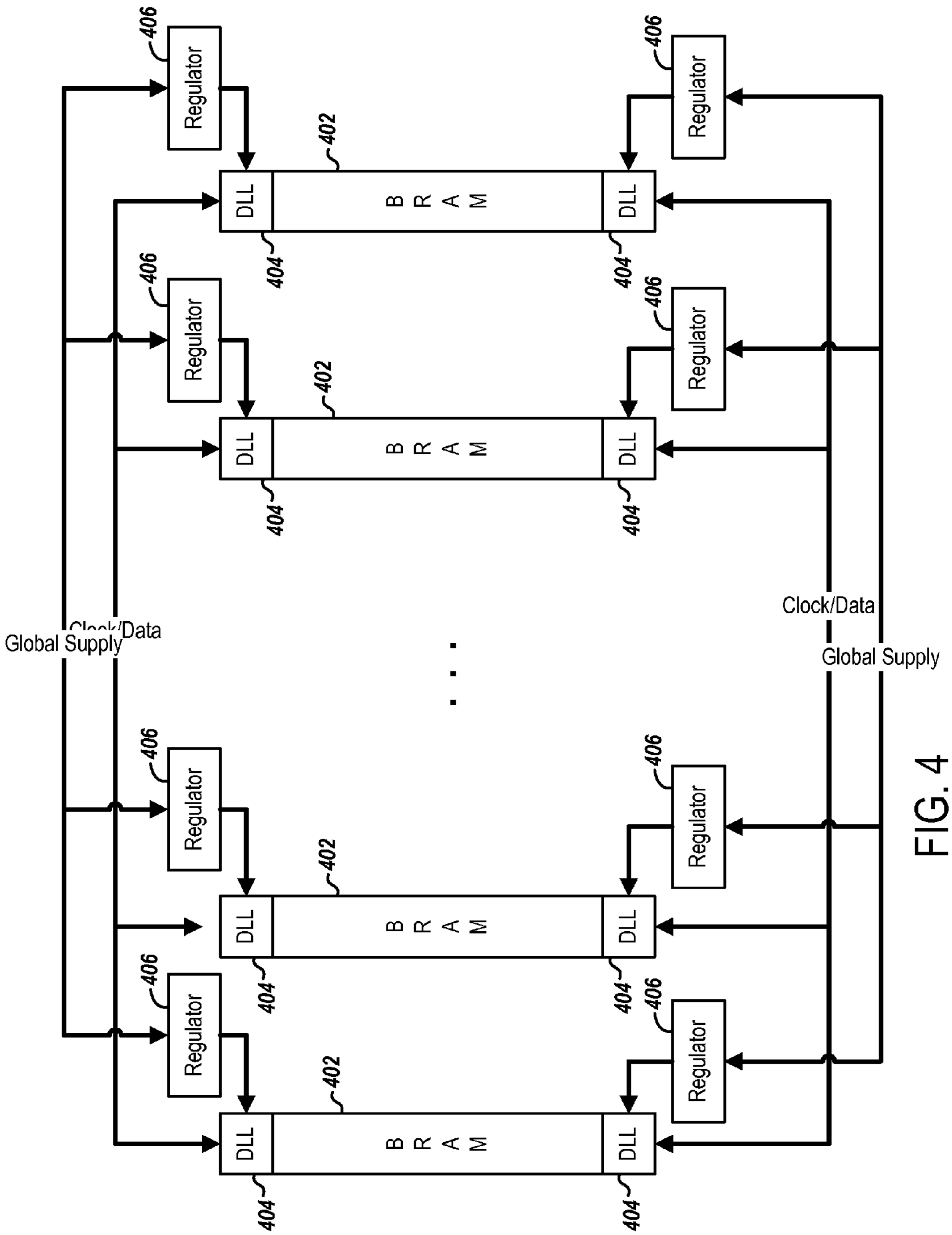
FIG. 4 depicts a set of logic circuits and associated voltage regulators, consistent with an embodiment of the present invention.

FIG. 4 depicts a set of logic circuits and associated voltage regulators, consistent with an embodiment of the present invention. The logic circuits include random access memory blocks (BRAM) 402. These logic circuits function based upon received clock and data signals, which can be relatively high-frequency signals. Such signals are susceptible to skew. Accordingly, DLL (or PLL) circuits 404 can be used to synchronize the phases of received signals or otherwise compensate for skew.

DLL/PLL circuits 404 are particularly susceptible to power supply noise. Accordingly, voltage regulator circuits 406 are included to regulate the global supply voltage.

FIG. 4 depicts BRAMs and DLLs as non-limiting examples of possible applications. A variety of different applications, circuits and devices are possible for use in connection with the present invention.

Figure 5:
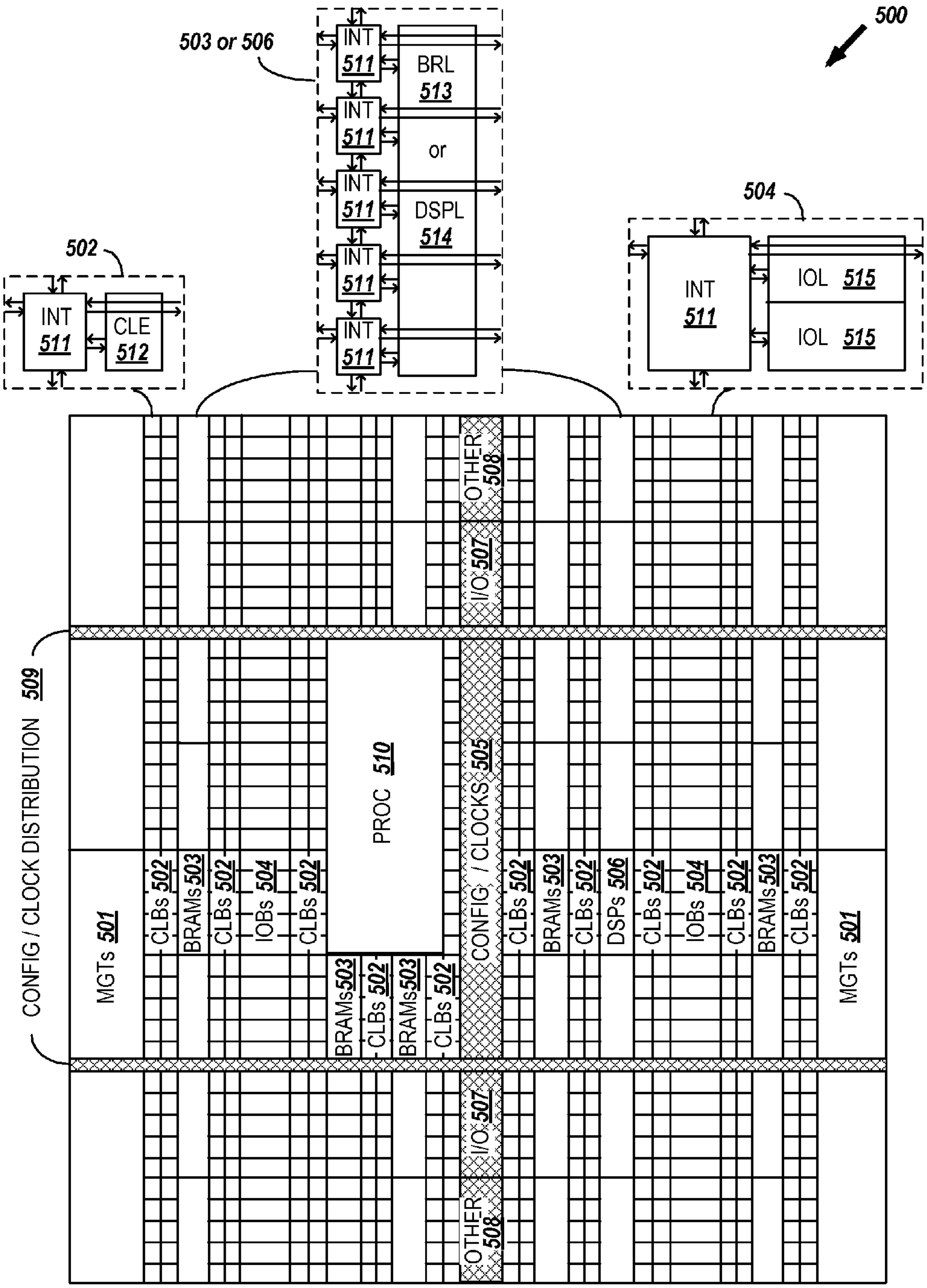
FIG. 5 is a block diagram of an example programmable integrated circuit that may be used in connection with voltage regulators in accordance with various embodiments of the invention.

FIG. 5 is a block diagram of an example FPGA that may be used in connection with voltage regulators in accordance with various embodiments of the invention. The voltage regulators, as previously described, may be implemented throughout the FPGA as desired. Those skilled in the art will recognize that the embodiments of the invention may be adapted for FPGA architectures different from the example architecture.

FPGAs can include several different types of programmable blocks in the array. For example, FIG. 5 illustrates an FPGA architecture (500) that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507), for example, e.g., clock ports, and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic plus a single programmable interconnect element NT 511. A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element INT 511. As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

The present invention is thought to be applicable to a variety of systems in which voltage regulation is desired. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An electronic arrangement comprising:

a subcircuit configured and arranged to generate a stable voltage at a node and compensate for low-frequency changes of the stable voltage, the low-frequency changes being within a bandwidth of the subcircuit;

a first field effect transistor (FET) having a gate, a drain and a source;

a current source connected to the drain of the first FET;

a second FET having a gate and a source, the source of the second FET connected to the source of the first FET by the node; and a low-pass filter circuit having an input connected to the gate of the first FET and an output connected to the gate of the second FET, wherein the second FET is configured and arranged to counteract high-frequency changes of the stable voltage at the node connecting the sources by increasing current drawn in response to increases of the stable voltage at the node and by decreasing current drawn in response to decreases of the stable voltage at the node, the high-frequency changes exceeding the bandwidth of the subcircuit.

2. The arrangement of claim 1, wherein the low-pass filter circuit includes a low-pass resistor-capacitor (RC) circuit.

3. The arrangement of claim 1, wherein the second FET mirrors a current through the first FET for a steady-state of the stable voltage of the node connecting the sources.

4. The arrangement of claim 1, wherein the low-pass filter circuit is configured to filter changes of voltage on the gate of the first FET from reaching the gate of the second FET.

5. The arrangement of claim 1, wherein the node is a low-impedance node providing the stable voltage that is a supply voltage.

6. The arrangement of claim 1, wherein the first FET, the current source, the second FET, and the low-pass filter circuit emulate a capacitor.

7. The arrangement of claim 1, wherein the first FET, the current source, the second FET, and the low-pass filter circuit operate at less than 600 μA during steady-state operation, and current drawn by the second FET is up to 2 mA in response to the high-frequency changes of the stable voltage at the node connecting the sources.

8. The arrangement of claim 1, wherein the low-pass filter circuit is designed with a corner frequency of 16 Mhz or higher, and the corner frequency is within the bandwidth of the subcircuit.

9. A system comprising:

a first feedback control circuit configured and arranged to generate a local supply voltage from a reference voltage, the first feedback control circuit having a bandwidth; and a second feedback circuit including:

a first field-effect transistor (FET), a current source configured and arranged to set an amount of current through the first FET, a second FET arranged to draw current from the local supply voltage that mirrors the amount of current through the first FET, and a filter circuit configured to inhibit the mirroring of current through the first FET by the second FET, the inhibition causing the second FET to increase current drawn from the local supply voltage by the second FET in response to increases in the local supply voltage that exceed the bandwidth of the first feedback control circuit and decrease current drawn from the local supply voltage by the second FET in response to decreases in the local supply voltage that exceed the bandwidth of the first feedback circuit.

10. The system of claim 9, wherein the filter circuit is a low-pass filter circuit connected between gates of the first and second FET.

11. The system of claim 9, further including one of a phase locked loop (PLL) and a delay locked loop (DLL) powered by the local supply voltage.

12. The system of claim 9, wherein the first feedback circuit generates the local supply voltage from a global supply voltage and wherein the second feedback circuit is further configured and arranged to inhibit the mirroring as a function of changes to the local supply voltage irrespective of changes to the global supply voltage.

13. The system of claim 9, wherein the second feedback circuit emulates a capacitor and takes up physical area that is at least 30 percent less than the emulated capacitor.

14. A programmable integrated circuit comprising:

programmable circuitry;

a plurality of local clock synchronization circuits distributed throughout the programmable circuitry; and a plurality of voltage regulator circuits providing a regulated voltage to the plurality of local clock synchronization circuits via a respective node, each voltage regulator circuit of the plurality including:

a subcircuit configured and arranged to generate the regulated voltage at the respective node, the subcircuit configured and arranged to compensate for low-frequency changes of the regulated voltage, the low-frequency changes within a bandwidth of the subcircuit; and a first field effect transistor (FET) having a gate, a drain and a source, a current source connected to the drain of the first FET, a second FET having a gate and a source, the source of the second FET connected to the source of the first FET by the respective node, and a low-pass filter circuit having an input connected to the gate of the first FET and an output connected to the gate of the second FET, wherein the second FET is configured and arranged to, responsive to the output of the low-pass filter circuit, counteract high-frequency changes of the regulated voltage at the respective node that connects the sources by increasing current drawn in response to increases of the regulated voltage at the respective node and by decreasing current drawn in response to decreases of the regulated voltage at the respective node, the high-frequency changes exceeding the bandwidth of the voltage regulator circuit.

15. The programmable integrated circuit of claim 14, wherein the plurality of local clock synchronization circuits includes one or more delay locked loops (DLLs), each DLL powered by the regulated voltage from a corresponding voltage regulator circuit of the plurality of voltage regulator circuits.

16. The programmable integrated circuit of claim 14, wherein the plurality of local clock synchronization circuits includes one or more phase locked loops (PLLs), each PLL powered by the regulated voltage from a corresponding voltage regulator circuit of the plurality of voltage regulator circuits.

17. The programmable integrated circuit of claim 14, wherein for each voltage regulator circuit:

the second FET is configured and arranged to draw current from the respective node that mirrors current that the current source sets through the first FET; and the low-pass filter circuit is configured and arranged to inhibit the mirroring, the inhibition responsive to the high-frequency changes of the regulated voltage.

18. The arrangement of claim 1, wherein the source of the first FET is directly connected to the source of the second FET.

19. The system of claim 9, wherein:

the first and second FETs each have respective gate, drain and source terminals; and the sources terminals of the first and second FETs are directly connected together and connected to the local supply voltage.

* * * * *